United States Patent
Colvin et al.

(10) Patent No.: US 10,676,370 B2
(45) Date of Patent: *Jun. 9, 2020

(54) HYDROGEN CO-GAS WHEN USING ALUMINUM IODIDE AS AN ION SOURCE MATERIAL

(71) Applicant: Axcelis Technologies, Inc., Beverly, MA (US)

(72) Inventors: Neil Colvin, Merrimack, NH (US); Tseh-Jen Hsieh, Rowley, MA (US); Neil Basson, Hamilton, MA (US)

(73) Assignee: Axcelis Technologies, Inc., Beverly, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/995,707

(22) Filed: Jun. 1, 2018

(65) Prior Publication Data
US 2018/0346342 A1 Dec. 6, 2018

Related U.S. Application Data

(60) Provisional application No. 62/515,324, filed on Jun. 5, 2017.

(51) Int. Cl.
*C01F 7/48* (2006.01)
*C23C 16/12* (2006.01)
(Continued)

(52) U.S. Cl.
CPC ............... *C01F 7/48* (2013.01); *C01B 7/135* (2013.01); *C23C 14/48* (2013.01); *C23C 16/12* (2013.01);
(Continued)

(58) Field of Classification Search
CPC . C01F 7/48; C01B 7/435; C23C 14/48; C23C 16/12; C23C 16/448; H01J 37/08;
(Continued)

(56) References Cited

U.S. PATENT DOCUMENTS 3,933,530 A * 1/1976 Mueller ............ H01L 21/31155
438/474
5,852,345 A 12/1998 Armini
(Continued)

FOREIGN PATENT DOCUMENTS

| JP | 60054150 A | * | 3/1985 | ............... H01J 27/02 |
| JP | S60-54150 | † | 3/1985 | |
| JP | H05-72053 | † | 10/1985 | |

OTHER PUBLICATIONS

International Search Report and Written Opinion dated Sep. 25, 2017 in connection with International Application No. PCT/US2017/038420.

(Continued)

*Primary Examiner* — David E Smith
(74) *Attorney, Agent, or Firm* — Eschweiler & Potashnik, LLC (57) ABSTRACT

An ion implantation system is provided having an ion source configured to form an ion beam from aluminum iodide. A beamline assembly selectively transports the ion beam to an end station configured to accept the ion beam for implantation of aluminum ions into a workpiece. An arc chamber forms a plasma from the aluminum iodide, where arc current from a power supply is configured to dissociate aluminum ions from the aluminum iodide. One or more extraction electrodes extract the ion beam from the arc chamber. A hydrogen co-gas source further introduces a hydrogen co-gas to react residual aluminum iodide and iodide, where the reacted residual aluminum iodide and iodide is evacuated from the system.

16 Claims, 3 Drawing Sheets

(51) Int. Cl.

| | |
|---|---|
| *H01J 37/317* | (2006.01) |
| *C01B 7/13* | (2006.01) |
| *C23C 14/48* | (2006.01) |
| *C23C 16/448* | (2006.01) |
| *H01L 21/02* | (2006.01) |
| *H01L 21/265* | (2006.01) |
| *H01J 37/08* | (2006.01) |
| *H01L 21/306* | (2006.01) |

(52) U.S. Cl.
CPC ............ *C23C 16/448* (2013.01); *H01J 37/08* (2013.01); *H01J 37/3171* (2013.01); *H01L 21/02019* (2013.01); *H01L 21/02167* (2013.01); *H01L 21/26506* (2013.01); *H01L 21/306* (2013.01); *H01J 2237/022* (2013.01); *H01J 2237/08* (2013.01); *H01J 2237/31705* (2013.01)

(58) Field of Classification Search
CPC ............. H01J 37/3171; H01J 2237/022; H01J 2237/08; H01J 2237/31705; H01L 21/02019; H01L 21/02167; H01L 21/26506; H01L 21/306
See application file for complete search history.

(56) References Cited

U.S. PATENT DOCUMENTS

| | | | |
|---|---|---|---|
| 6,818,909 B2 | 11/2004 | Murrell et al. | |
| 9,165,773 B2 | 10/2015 | Sinha | |
| 10,087,520 B2* | 10/2018 | Kamenitsa | C01B 32/956 |
| 2002/0070672 A1* | 6/2002 | Horsky | H01J 37/08 315/111.81 |
| 2003/0038246 A1 | 2/2003 | Reyes | |
| 2004/0016404 A1 | 1/2004 | Gregg et al. | |
| 2009/0294698 A1 | 12/2009 | Ray | |
| 2010/0221917 A1 | 9/2010 | Masuda | |
| 2010/0255198 A1 | 10/2010 | Cleary | |
| 2011/0220812 A1 | 9/2011 | Chaney | |
| 2012/0119113 A1* | 5/2012 | Colvin | H01J 37/08 250/492.3 |
| 2013/0260543 A1* | 10/2013 | Koo | C23C 14/48 438/515 |
| 2014/0329025 A1 | 11/2014 | Cleary | |
| 2015/0087108 A1 | 3/2015 | Salabas | |
| 2017/0362699 A1 | 12/2017 | Kamenitsa et al. | |
| 2017/0362700 A1 | 12/2017 | Kamenitsa et al. | |

OTHER PUBLICATIONS

Notice of Allowance received Jun. 7, 2018 in connection with U.S. Appl. No. 15/627,952.
Non-Final Office Action dated Aug. 29, 2019 in connection with U.S. Appl. No. 15/627,989.
International Search Report dated Sep. 10, 2018 in connection with International Application No. PCT/US2018/035833.
Non-Final Office Action dated Feb. 4, 2020 in connection with U.S. Appl. No. 15/627,989.

\* cited by examiner
† cited by third party

HYDROGEN CO-GAS WHEN USING ALUMINUM IODIDE AS AN ION SOURCE MATERIAL

REFERENCE TO RELATED APPLICATIONS

This application claims the benefit of U.S. Provisional Application No. 62/515,324 filed Jun. 5, 2017, entitled "HYDROGEN CO-GAS WHEN USING ALUMINUM IODIDE AS AN ION SOURCE MATERIAL", the contents of which are herein incorporated by reference in their entirety.

FIELD

The present invention relates generally to ion implantation systems, and more specifically to an ion implantation system having an aluminum iodide ion source material using a hydrogen co-gas and associated beamline components with mechanisms for in-situ cleaning of the ion implantation system.

BACKGROUND

Ion implantation is a physical process that is employed in semiconductor device fabrication to selectively implant dopant into semiconductor and/or wafer material. Thus, the act of implanting does not rely on a chemical interaction between a dopant and semiconductor material. For ion implantation, dopant atoms/molecules from an ion source of an ion implanter are ionized, accelerated, formed into an ion beam, analyzed, and swept across a wafer, or the wafer is translated through the ion beam. The dopant ions physically bombard the wafer, enter the surface and come to rest below the surface, at a depth related to their energy.

Ion sources in ion implanters typically generate the ion beam by ionizing a source material in an arc chamber, wherein a component of the source material is a desired dopant element. The desired dopant element is then extracted from the ionized source material in the form of the ion beam.

Conventionally, when aluminum ions are the desired dopant element, materials such as aluminum nitride (AlN) and alumina ($Al_2O_3$) have been used as a source material of aluminum ions for the purpose of ion implantation. Aluminum nitride or alumina are solid, insulative materials which are typically placed in the arc chamber where the plasma is formed (in the ion source).

A gas (e.g., fluorine) is conventionally introduced to chemically etch the aluminum-containing materials, whereby the source material is ionized, and aluminum is extracted and transferred along the beamline to silicon carbide workpiece positioned in an end station for implantation thereto. The aluminum-containing materials, for example, are commonly used with some form of etchant gas (e.g., $BF_3$, $PF_3$, $NF_3$, etc.) in the arc chamber as the source material of the aluminum ions. These materials, however, have the unfortunate side effect of producing insulating material (e.g., AlN, $Al_2O_3$, etc.) which is emitted along with the intended aluminum ions from the arc chamber.

The insulating material subsequently coats various components of the ion source, such as extracting electrodes, which then begin to build an electric charge and unfavorably alter the electrostatic characteristic of the extraction electrodes. The consequence of the electric charge build-up results in behavior commonly referred to as arcing, or "glitching", of the extraction electrodes as the built-up charge arcs to other components and or to ground. In extreme cases, behavior of a power supply for the extraction electrodes can be altered and distorted. This typically results in unpredictable beam behavior and leads to reduced beam currents and frequent preventive maintenance to clean the various components associated with the ion source. Additionally, flakes and other residue from these materials can form in the arc chamber, thus altering its operational characteristics, leading to additional frequent cleaning.

SUMMARY

The present disclosure overcomes the limitations of the prior art by providing a system, apparatus, and method for improving performance and extending the lifetime of an ion source in an ion implantation system for aluminum implants. Accordingly, the following presents a simplified summary of the disclosure in order to provide a basic understanding of some aspects of the disclosure. This summary is not an extensive overview of the disclosure. It is intended to neither identify key or critical elements of the invention nor delineate the scope of the invention. Its purpose is to present some concepts of the disclosure in a simplified form as a prelude to the more detailed description that is presented later.

Aspects of the disclosure facilitate ion implantation processes for implanting aluminum ions into a workpiece. According to one exemplary aspect, an ion implantation system is provided having an ion source configured to form an ion beam, a beamline assembly configured to selectively transport the ion beam, and an end station is configured to accept the ion beam for implantation of the aluminum ions into a workpiece.

In accordance with one exemplary aspect, an aluminum iodide source material is provided, wherein the ion source is configured to ionize the aluminum iodide source material and form the ion beam therefrom. A hydrogen introduction apparatus, for example, is configured to introduce a reducing agent comprising hydrogen to the ion source. In one example, the hydrogen introduction apparatus comprises a hydrogen co-gas source, wherein the hydrogen from the reducing agent alters the chemistry of the non-conducting material to produce a volatile gas by-product. The hydrogen introduction apparatus, for example, may comprise a pressurized gas source, wherein the pressurized gas source may comprise one or more of hydrogen gas and phosphine gas.

In another example, the ion implantation system further comprises a water introduction apparatus configured to introduce water vapor to the ion implantation system. A vacuum system may be further provided and configured to substantially evacuate one or more enclosed portions of the ion implantation system. The one or more enclosed portions of the ion implantation system, for example, may comprise the ion source.

In yet another example, the aluminum iodide source material is in one of a solid form and a powder form. Accordingly, the ion implantation system may further comprise a source material vaporizer operably coupled to the ion source, wherein the source material vaporizer is configured to vaporize the aluminum iodide source material.

According to another exemplary aspect of the present disclosure, a method for implanting aluminum ions into a workpiece is provided. In one example, the method comprises vaporizing an aluminum iodide source material and providing the vaporized aluminum iodide source material to an ion source of an ion implantation system. The aluminum iodide source material may be initially in one of a solid and powder form. A hydrogen co-gas is further provided to the ion source, and the aluminum iodide source material is ionized in the ion source, wherein the hydrogen co-gas reacts with the vaporized aluminum iodide within the ion source to produce volatile hydrogen iodide gas. The volatile hydrogen iodide gas via a vacuum system, and aluminum ions from the ionized aluminum iodide source material are implanted into a workpiece.

In one example, providing the hydrogen co-gas to the ion source comprises providing one or more of hydrogen gas and phosphine to the ion source. In another example, one or more of residual aluminum iodide and hydroiodic acid are cleaned from one or more internal components of the ion implantation system by introducing water vapor to the one or more internal components of the ion implantation system. Introducing water vapor to the internal components of the ion implantation system, for example, comprises introducing atmospheric air to the one or more internal components of the ion implantation system. In another example, introducing water vapor to the one or more internal components of the ion implantation system comprises controlling a flow of water to the one or more internal components through a supply line under vacuum, thereby vaporizing the water. The method, in another example, further comprises evacuating the ion implantation system, therein substantially removing the water vapor and residual aluminum iodide and hydroiodic acid.

In accordance with another example, a method is provided for cleaning an ion implantation system using an aluminum iodide source material that produces residual aluminum iodide, wherein the method comprises introducing a hydrogen co-gas to the ion implantation system, therein reacting the residual aluminum iodide with the hydrogen co-gas to form hydrogen iodide. Further, the ion implantation system is evacuated, therein removing the hydrogen iodide from the ion implantation system. The hydrogen co-gas, for example, may comprise one or more of hydrogen gas and phosphine. Introducing the hydrogen co-gas to the ion implantation system may comprise introducing the hydrogen gas and phosphine from a pressurized gas source. In another example, an aluminum iodide source material is vaporized and provided to an ion source of the ion implantation system, thereby forming the residual aluminum iodide.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

The present disclosure is directed generally toward an ion implantation system and an ion source material associated therewith. More particularly, the present disclosure is directed toward components for said ion implantation system using an aluminum iodide ($AlI_3$) solid source material for producing atomic aluminum ions to electrically dope silicon, silicon carbide, or other semiconductor substrates at various temperatures, ranging up to 1000° C. Further, the present disclosure minimizes iodide deposits on extraction electrodes and source chamber components when using aluminum iodide as an ion source vaporizer material. The present disclosure will thus reduce associated arcing and glitching, and will further increase overall lifetimes of the ion source and associated electrodes.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

Figure 1:
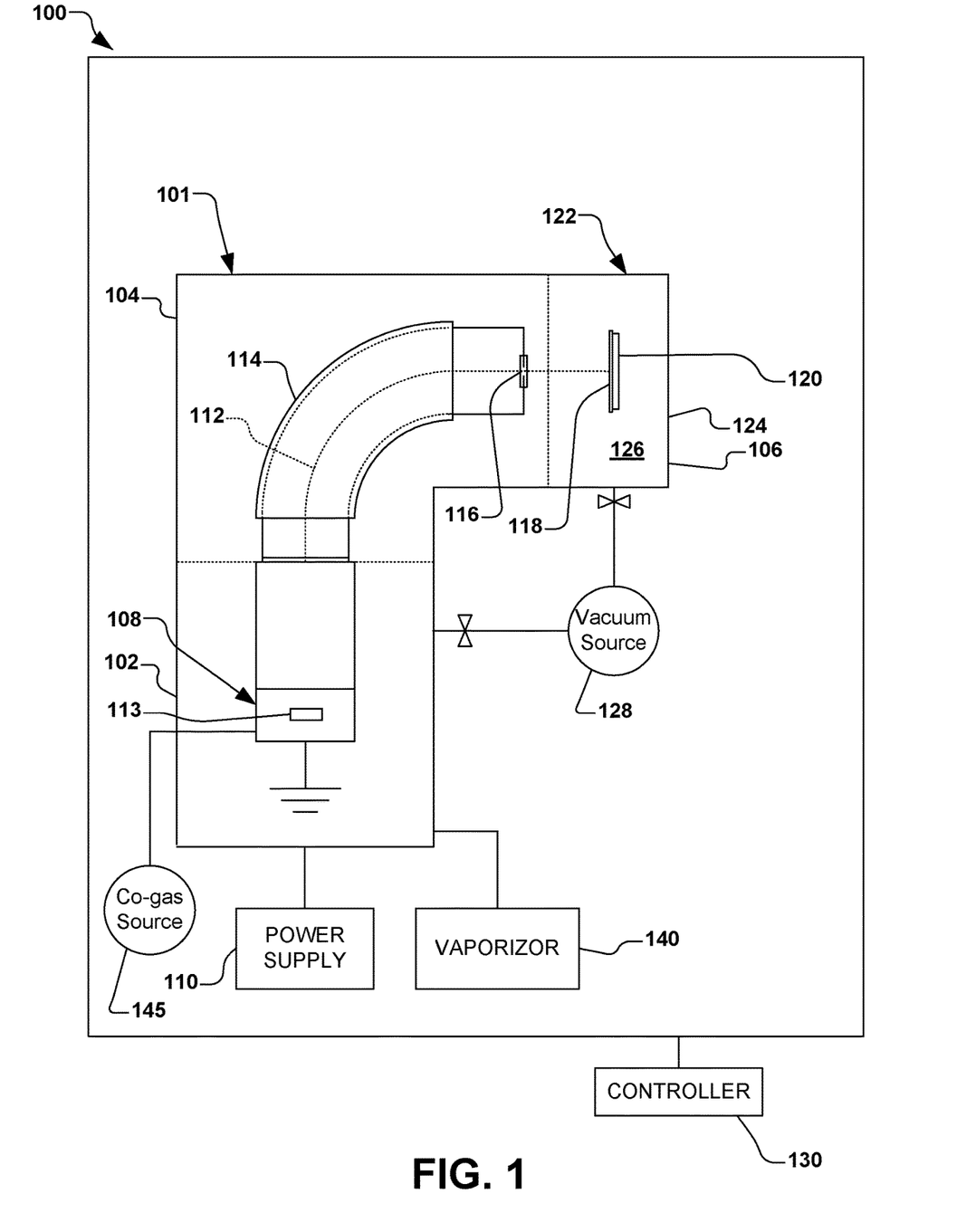
FIG. 1 is a block diagram of an exemplary vacuum system utilizing an aluminum iodide ion source material in accordance with several aspects of the present disclosure.

In accordance with one aspect of the present disclosure, FIG. 1 illustrates an exemplary vacuum system 100. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source 108 in the terminal 102 is coupled to a power supply 110 to ionize a dopant gas into a plurality of ions from the ion source to form an ion beam 112. Individual electrodes in close proximity to the extraction electrode may be biased to inhibit back streaming of neutralizing electrons close to the source or back to the extraction electrode. An ion source material 113 of the present disclosure is provided in the ion source 108, wherein the ion source material comprises aluminum iodide ($AlI_3$), as will be discussed in further detail infra.

The ion beam 112 in the present example is directed through a beam-steering apparatus 114, and out an aperture 116 towards the end station 106. In the end station 106, the ion beam 112 bombards a workpiece 118 (e.g., a semiconductor such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber. Further, a controller 130 is provided for overall control of the vacuum system 100.

The present disclosure appreciates that workpieces 118 having silicon carbide-based devices formed thereon have been found to have better thermal and electrical characteristics than silicon-based devices, in particular, in applications used in high voltage and high temperature devices, such as electric cars, etc. Ion implantation into silicon carbide, however, utilizes a different class of implant dopants than those used for silicon workpieces. In silicon carbide implants, aluminum and nitrogen implants are often performed. Nitrogen implants, for example, are relatively simple, as the nitrogen can be introduced as a gas, and provides relatively easy tuning, cleanup, etc. Aluminum, however, is more difficult, as there are presently few good gaseous solutions of aluminum known.

Conventionally, materials such as aluminum nitride (AlN), alumina ($Al_2O_3$), etc. have been used as a source of aluminum ions for the purpose of ion implantation. Aluminum nitride or alumina are solid, insulative materials which are typically placed in the arc chamber where the plasma is formed (in the ion source). A gas (e.g., fluorine) is conventionally introduced to chemically etch the aluminum-containing materials, whereby the material is ionized, and aluminum is extracted and transferred along the beamline to silicon carbide workpiece positioned in the end station. For example, the aluminum-containing materials are commonly used with some form of etchant gas (such as $BF_3$, $PF_3$, $NF_3$, etc.) in the arc chamber as the source of the aluminum ions. These materials have the unfortunate side effect of producing insulating material (e.g., AlN, $Al_2O_3$, etc.) which is emitted along with the intended ions from the arc chamber.

This insulating material subsequently coats various components of the ion source, such as extracting electrodes, which then begin to charge up and unfavorably alter the electrostatic characteristic of these electrodes and build up charge on them. This results in behavior commonly referred to as glitching, or arcing, of these electrodes as the built up charge arcs to other components and or ground. In extreme cases, power supply behavior can be altered and distorted. This results in unpredictable beam behavior and leads to frequent preventive maintenance to clean these components and reduced beam currents. Additionally, flakes and other residue from these materials form in the arc chamber, thus altering its operational characteristics, leading to frequent cleaning.

The present disclosure contemplates using aluminum iodide ($AlI_3$) to produce atomic aluminum ions, whereby the aforementioned insulating materials, flakes, etc., are not produced and do not build up, thus extending the lifetime of the ion source and electrodes, producing a more stable ion beam operation, and allowing substantially higher beam currents.

Thus, the present disclosure produces single atom aluminum ions from aluminum iodide ($AlI_3$) solid source material to electrically dope a silicon carbide, silicon, or other substrate, at temperatures from room temperature to approximately 1000° C., with improved source lifetimes, beam currents, and operational characteristics than current techniques.

In accordance with the present disclosure, aluminum iodide ($AlI_3$, commonly found in a powder or other solid form) is inserted into a solid source vaporizer 140 of the ion implantation system 101 (e.g., a suitable ion implanter manufactured by Axcelis Technologies of Beverley, Mass.). Aluminum iodide is a hydroscopic temperature-sensitive powdery material that can be heated in the vaporizer 140 of the ion source 108 to produce a generally constant stream of molecules to be introduced into the arc chamber for ion implantation.

After insertion of the ion source 108 into the ion implanter's vacuum system 100, this material is heated to the appropriate temperature to produce the evolution of sufficient material to the ion source to form a plasma (with or without a co-gas such as argon to help initiate the formation of the plasma in the ion source). When the aluminum iodide reaches the appropriate temperature, enough material is evolved such that a stable plasma can be produced in the ion source 108 by the alumni iodide alone, or in a combination with a co-gas. Single-atom aluminum ions are then electrostatically extracted and manipulated to form the ion beam 112 and transported to the workpiece 120 (e.g., silicon carbide, silicon, etc.) to be implanted with the aluminum.

The molecules are weakly bonded and can be dissociated in the plasma, such as:

$$Al\ I_3 \rightarrow AL(s) + 3I(s) \qquad (1).$$

The by-product of iodine, for example, is an insulator of generally solid form that coats the various components such as electrode plates of the ion source 108, whereby the coating can lead to electrical charging and subsequent arcing in high electric fields. Such arcing or "glitches" associated with extraction and suppression electrodes negatively affect utilization of the ion beam 112 and stability thereof. Electrical ground returns in such high voltage stress areas, for example, can be further coated with this non-conducting material, whereby charging and discharging can occur due to the presence of secondary electrons generated by the ion beam 112.

Thus, the present disclosure introduces a reducing agent, such as hydrogen, to the ion source 108 from a hydrogen co-gas source 145, whereby the reducing agent alters the chemistry of the non-conducting material to convert it a volatile gas by-product (e.g., hydrogen iodide, HI). The reducing agent, for example, may be referred to as a co-gas. For example, the following equation is one example:

$$Al\ I_3 + H_2 + H_2O \rightarrow AL(s) + 3HI(g) + OH \qquad (2).$$

The water ($H_2O$) in equation (2) may be present on surfaces (e.g., source chamber walls or other interior surfaces) of the ion source 108 from previous exposure to atmosphere, whereby the water may evolve from such surfaces when subjected to heat from the ion source. Accordingly, the volatile material may be further pumped away utilizing one or more vacuum pumps 128 (e.g., a high vacuum pump) associated with the process chamber 122 in equation (2). It should be noted that the present disclosure further contemplates the hydrogen co-gas source 145 providing other hydrogen-containing co-gases, such as phosphine ($PH_3$) or hydrogen gas ($H_2$). The hydrogen co-gas source 145 thus provides for the in-situ introduction of a hydrogen co-gas to the system 100 of FIG. 1. Using phosphine as a co-gas, for example, may be preferable over the use of hydrogen has ($H_2$), as high-pressure (e.g., bottled) hydrogen gas is highly volatile and often not permitted in fabrication facilities due to its hazardous and explosive nature.

The kinetics of the reaction shown in equation (2) from iodide and hydrogen, for example, is generally favorable. For example, the reaction shown in equation (2) reduces the overall energy after forming the volatile gas by-product (e.g., HI). The volatile gas by-product, for example, is continuously pumped away as it forms by the one or more vacuum pumps of the vacuum source 128.

The present disclosure indicates that the introduction of hydrogen has provided signs of a reaction with the formation of powder on interior surfaces of the ion source 108, as well as a reduction at $I^{++}$ (amu-63.5) of beam intensity, which is indicative of the chemical reaction of equation (2) taking place. Furthermore, a reduction of beam intensity has been found at amu-127, which is the $I^+$ ion location.

The present disclosure further provides a technique of in-situ cleaning of aluminum iodide and any of its by-products from the ion source 108 and source region, resulting from using aluminum iodide ($AlI_3$, etc.) as an aluminum source material for implanting atomic aluminum ions into silicon, silicon carbide, or other semiconductor substrates.

Aluminum iodide, for example, is a solid material which is positioned in the source vaporizer 140 in the ion implantation system 101. The solid material is vaporized by heating it to an appropriate temperature in the source vaporizer 140 and the resulting aluminum iodide vapor is dissociated, then ionized, in the source ionization chamber to produce atomic aluminum ions which are extracted for the ion implant process. Any un-ionized (either molecular or non-dissociated) material may accumulate on interior surfaces or break down into several components, the main components of which are iodide, aluminum iodide and aluminum. Aluminum, for example, is the target material for the process, while iodine is relatively inert, but an insulator. Residual aluminum iodide is highly reactive when exposed to water and/or atmosphere and forms hydroiodic acid (a very strong corrosive acid) when exposed to atmosphere, which then breaks down further to form hydrogen iodide.

The vaporizers in the source are loaded with aluminum iodide material in an inert environment (e.g., argon, nitrogen, etc.) so as not to start reacting the material with moisture in the air. The source is then installed in an Ion Implanter and pumped down with vacuum to the implanter's operating pressure. The aluminum iodide is heated in the vaporizer until it forms a vapor which migrates to the ionization chamber where the aluminum is ionized and extracted down the beamline. Inside the source housing (and other beam-line components) un-reacted Aluminum Iodide vapor re-solidifies on colder surfaces. Iodide, a byproduct of the reaction also coats the source (and other beam line component) walls. When the initial aluminum iodide material is exhausted or used up, the source is removed, cleaned and reloaded with Aluminum Iodide to continue the process. It is at this time that the un-reacted aluminum iodide and iodide may be exposed to air where $I_2$ sublimes into a gas or reacts with water and/or oxygen to form and hydrogen iodide and inert, fully-reacted iodide oxide.

However, if the aluminum iodide can be exposed to water vapor in-situ, forming a liquid-like inert residue, some portion of the residue can be in a vapor phase and pumped out and removed through the implanter's vacuum system exhaust. This in-situ exposure to water vapor can be either periodic, as during a daily shut-down cycle, or in a single series of exposures (purge and pump cycles) at the end of the source's lifetime (or even in a separate dedicated vessel for this purpose).

Using water vapor introduced to the appropriate areas within the source housing at the proper times reacts the aluminum Iodide and iodide to allow it to be removed by the implanter's vacuum system and to help neutralize any remaining material and allow it to be cleaned with a basic solution, such as isopropyl alcohol or similar. The water vapor must be properly controlled to react the Aluminum Iodide byproducts in a safe manner that minimizes any chemical reaction and the corrosive aspects.

Without this in-situ cleaning, the amount of unreacted aluminum iodide and iodide would lead to special decontamination protocols and disposal. Thus, the present disclosure addresses the introduction of water vapor into the vacuum system (or alternate external vessel) to allow the formation of $AlI_3$ by-products, to allow the removal of these out-gassing by-products, by the one or more vacuum pumps of the vacuum source 128 and.

This can be accomplished in-situ during regular machine shutdown periods, such as by utilizing a standby beam operation (e.g., overnight). Alternatively, it can be accomplished in-situ at the end of the source vaporizer lifetime with a series of individual purge/pump cycles (e.g., at higher pressures such as atmospheric pressure), or a single purge (e.g., as high as atmospheric pressure), followed by a pump down cycle. A dedicated external vessel can be further provided for the above purging and pumping.

The present disclosure thus utilizes solid or powdered aluminum iodide ($AlI_3$) which is placed in a vaporizer (e.g., a cylindrical oven) that is heated by heating coils. The aluminum iodide is vaporized and the vaporized material comes out through a tube to the arc chamber (e.g., the ion source 108), where it is ionized and transported along the beamline to be implanted into the workpiece 112.

Figure 2:
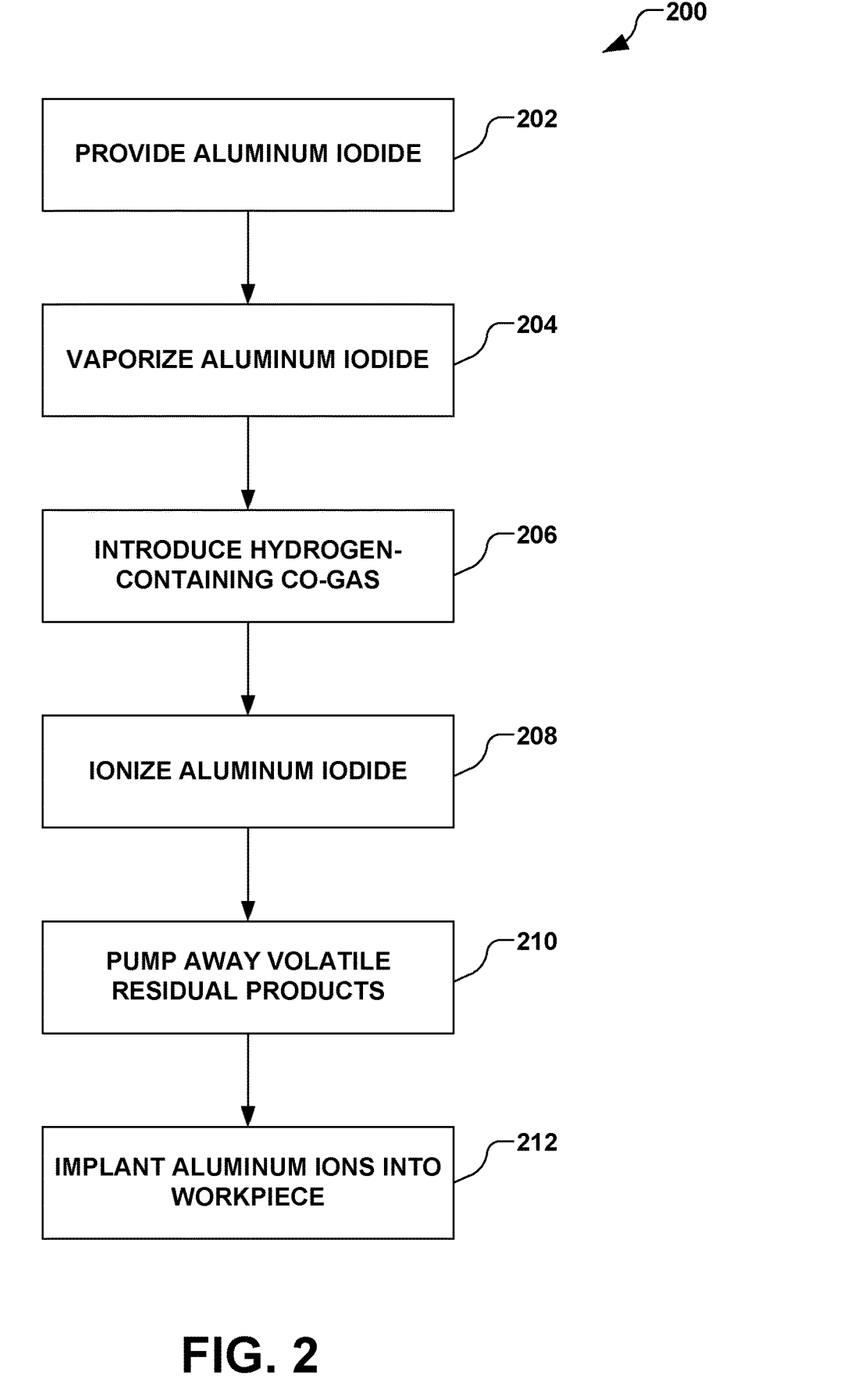
FIG. 2 illustrates an exemplary method for implanting aluminum ions into a workpiece using aluminum iodide as a source material.

FIG. 2 illustrates an exemplary method 200 for implanting aluminum ions into a workpiece. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

In accordance with one exemplary aspect, in act 202 of FIG. 2, aluminum iodide is provided. The aluminum iodide source material, for example, may be in a solid-form or powder-form. In act 204, for example, the aluminum iodide source material is vaporized and provided to an ion source. In act 206, a hydrogen co-gas is provided or otherwise introduced to the ion source. The hydrogen co-gas, for example, comprises one or more of hydrogen gas and phosphine gas. In act 208, the aluminum iodide source material is ionized in the ion source, wherein the hydrogen co-gas reacts with the vaporized aluminum iodide within the ion source to produce volatile hydrogen iodide gas. In act 210, the volatile hydrogen iodide gas is pumped away or otherwise removed via a vacuum system. Further, in act 212, aluminum ions from the ionized aluminum iodide source material are implanted into a workpiece.

Figure 3:
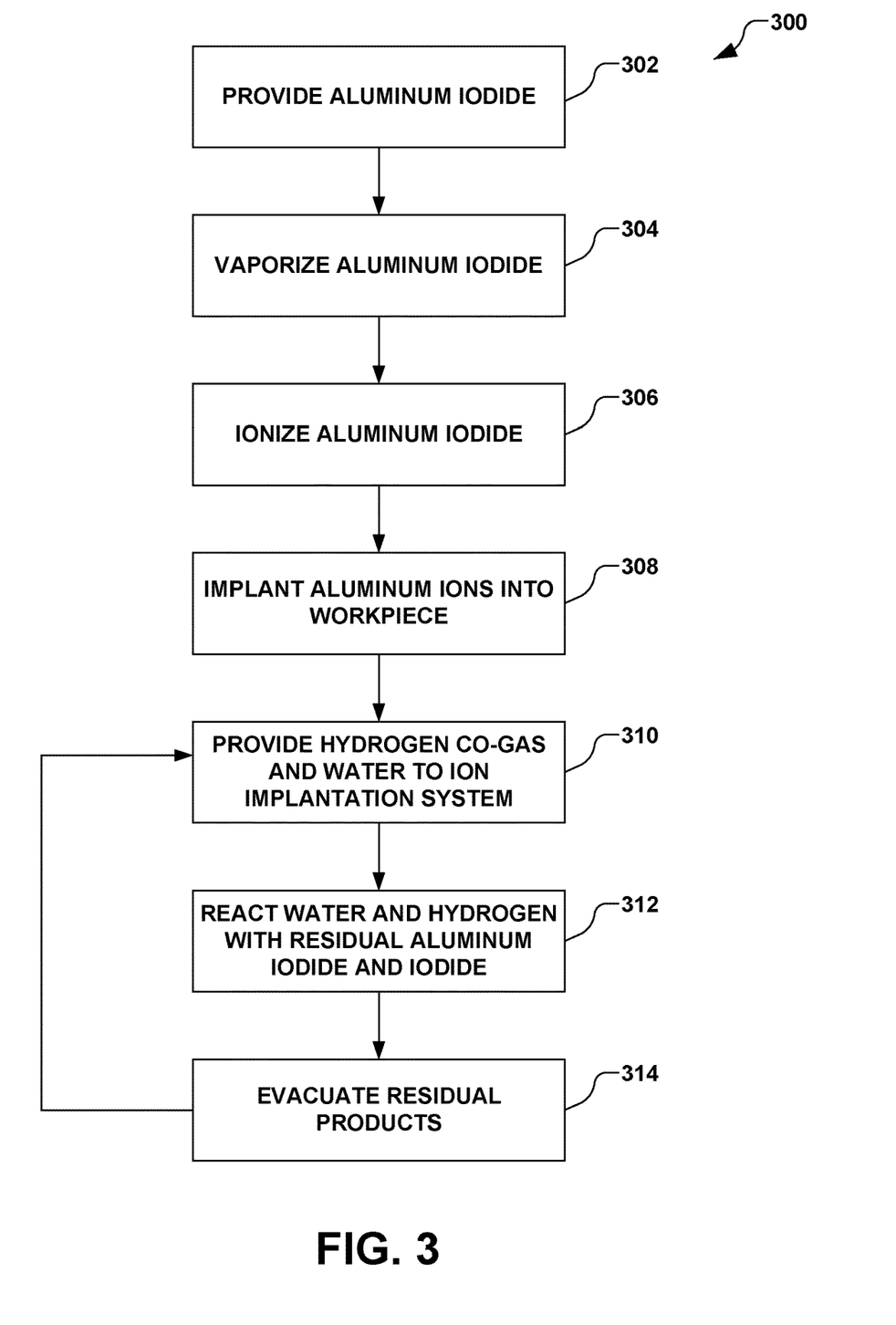
FIG. 3 illustrates an exemplary method for cleaning an ion implantation system that uses aluminum iodide as a source material.

In accordance with another exemplary aspect of the present disclosure, FIG. 3 illustrates another method 300 for implanting aluminum ions into a workpiece. For example, the method 300 comprises providing aluminum iodide source material in act 302. The aluminum iodide source material provided in act 302, for example, may be in a solid-form or powder-form. In act 304, for example, the aluminum iodide source material is vaporized and provided to an ion source. In act 306, the aluminum iodide source material is ionized in the ion source, and in act 308, aluminum ions from the ionized aluminum iodide source material are implanted into a workpiece.

In act 310, a hydrogen co-gas is provided or otherwise introduced to the ion source. The hydrogen co-gas, for example, comprises one or more of hydrogen gas and phosphine gas. In another example, water vapor is also introduced to one or more internal components of the ion implantation system. Introducing water vapor to the internal components of the ion implantation system in act 310, for example, may comprise introducing atmospheric air to the one or more internal components of the ion implantation system. In one alternative, introducing water vapor to the one or more internal components of the ion implantation system comprises controlling a flow of water to the one or more internal components through a supply line under vacuum, thereby vaporizing the water.

In act 312, the hydrogen co-gas and/or vaporized water reacts with the vaporized aluminum iodide within the ion source to produce volatile hydrogen iodide gas within the ion source to produce volatile hydrogen iodide gas. Act 312, for example, further comprises cleaning one or more of residual aluminum iodide and iodide from one or more internal components of the ion implantation system via the reaction of the hydrogen co-gas and water with the vaporized aluminum iodide.

In act 314, the volatile hydrogen iodide gas is pumped away or otherwise removed via a vacuum system. For example, the ion implantation system is evacuated, therein substantially removing the water vapor and residual aluminum iodide and hydroiodic acid.

Aluminum iodide is traditionally a difficult material to utilize in ion implantation, as it is hygroscopic material which absorbs water from the atmosphere to form HI and acid (e.g., hydroiodic acid), as well as gaseous $I_2$. Thus, aluminum iodide and its byproducts are difficult to handle (e.g., a glove box with inert gas is typically used to handle the material), and components are often carefully cleaned after use, etc. While the aluminum iodide is in the vaporizer and at the desired processing temperature (e.g., temperatures ranging from 90-100° C.), however, it typically performs well without producing the byproducts seen in alumina, etc.

Like any source material, residual materials are typically left behind. When implanting with gaseous source materials, the residual materials can be typically pumped out of the system via the vacuum system. When implanting utilizing solid source materials, however, the residual is usually a solid that emerges from the ion source unionized, whereby the unionized material coats the next cool surface that it encounters along the beamline. With aluminum iodide, the unionized $AlI_3$ coats cooler components in the beamline, and since the material is hygroscopic, the removal of components and exposure to water vapor in the air can cause difficulties in cleaning. The present disclosure, however, introduces a hydrogen co-gas (e.g., in situ introduction of hydrogen or a hydrogen-containing gas, such as phosphine) at the end of the lifetime of the charge of the solid material or concurrent with operation of the ion source for subsequent evacuation of a resultant volatile hydrogen iodide through the vacuum system.

The present disclosure appreciates that some manual cleaning may still need to be performed, but the majority of the $AlI_3$ is removed via the water vapor. A manual cleaning can be further performed using isopropyl alcohol.

One approach is to introduce water vapor while the ion source is cooling down. If a small amount of water vapor is introduced periodically, the system can be continually kept clean during operation, and a large amount of cleanup is not needed at the end.

Alternatively, the system can be exposed to a large amount of water vapor at the end of use of the source material, wherein the system is pumped down, and the exposure is repeated several times. Due to the low temperature characteristics, it is appreciates that warm components are not affected as much by the material build-up, and build-up often occurs at non beam-strike areas.

In one example, at the end of a work cycle using a solid source material (e.g., the end of the production day), a "shut down beam" is run (e.g., an argon beam) to keep an active plasma in the arc chamber while the vaporizer temperatures are turned down and the material cools off, thus substantially preventing a non-ionizing environment while cooling down. Thus, the argon beam keeps the components warm, and during that period of cool down, a controlled amount of water vapor is injected into the system during the last hours of operation during the day.

As an alternative to the in-situ introduction of water vapor, a larger exposure of water vapor is introduced and the system and subsequently vented to air, whereby the $AlI_3$ is liquefied or vaporized, and then pumped out via the vacuum system.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion implantation system, comprising:
    an aluminum iodide source material;
    an ion source configured to ionize the aluminum iodide source material and form an ion beam therefrom, and whereby the ionization of the aluminum iodide source material further forms a by-product comprising a non-conducting material containing iodine;
    a hydrogen introduction apparatus configured to introduce a reducing agent comprising hydrogen to the ion source, wherein the reducing agent is configured to alter a chemistry of the non-conducting material to produce a volatile gas by-product;
    a beamline assembly configured to selectively transport the ion beam; and
    an end station configured to accept the ion beam for implantation of ions into a workpiece.

2. The ion implantation system of claim 1, wherein the hydrogen introduction apparatus comprises a hydrogen co-gas source, wherein the hydrogen from the reducing agent alters the chemistry of the non-conducting material to produce hydrogen iodide.

3. The ion implantation system of claim 1, wherein the hydrogen introduction apparatus comprises a pressurized gas source.

4. The ion implantation system of claim 3, wherein the pressurized gas source comprises one or more of hydrogen gas and phosphine.

5. The ion implantation system of claim 1, further comprising a water introduction apparatus configured to introduce water vapor to the ion implantation system.

6. The ion implantation system of claim 1, further comprising a vacuum system configured to substantially evacuate one or more enclosed portions of the ion implantation system.

7. The ion implantation system of claim 6, wherein the one or more enclosed portions of the ion implantation system comprise the ion source.

8. The ion implantation system of claim 1, wherein the aluminum iodide source material is in one of a solid form and a powder form.

9. The ion implantation system of claim 8, further comprising a source material vaporizer operably coupled to the ion source, wherein the source material vaporizer is configured to vaporize the aluminum iodide source material.

10. A method for implanting aluminum ions into a workpiece using the system of claim 1, the method comprising:
    vaporizing an aluminum iodide source material;
    providing the vaporized aluminum iodide source material to an ion source of an ion implantation system;
    providing a hydrogen co-gas to the ion source;
    ionizing the aluminum iodide source material in the ion source, wherein the hydrogen co-gas reacts with the vaporized aluminum iodide within the ion source to produce volatile hydrogen iodide gas;
    removing the volatile hydrogen iodide gas via a vacuum system; and
    implanting aluminum ions from the ionized aluminum iodide source material into a workpiece.

11. The method of claim 10, wherein the aluminum iodide source material is initially in one of a solid and powder form.

12. The method of claim 10, wherein providing the hydrogen co-gas to the ion source comprises providing one or more of hydrogen gas and phosphine to the ion source.

13. The method of claim 10, further comprising cleaning one or more of residual aluminum iodide and iodide from one or more internal components of the ion implantation system by introducing water vapor to the one or more internal components of the ion implantation system.

14. The method of claim 13, wherein introducing water vapor to the internal components of the ion implantation system comprises introducing atmospheric air to the one or more internal components of the ion implantation system.

15. The method of claim 13, wherein introducing water vapor to the one or more internal components of the ion implantation system comprises controlling a flow of water to the one or more internal components through a supply line under vacuum, thereby vaporizing the water.

16. The method of claim 13, further comprising evacuating the ion implantation system, therein substantially removing the water vapor and residual hydrogen iodide and I2.

* * * * *